(12) United States Patent
Qawami

(10) Patent No.: US 7,725,645 B2
(45) Date of Patent: May 25, 2010

(54) DUAL USE FOR DATA VALID SIGNAL IN NON-VOLATILE MEMORY

(75) Inventor: Shekoufeh Qawami, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 394 days.

(21) Appl. No.: 11/724,811

(22) Filed: Mar. 16, 2007

(65) Prior Publication Data

US 2008/0228999 A1 Sep. 18, 2008

(51) Int. Cl.
*G06F 13/00* (2006.01)

(52) U.S. Cl. ............................. 711/103; 711/167

(58) Field of Classification Search .................. 711/103, 711/167

See application file for complete search history.

(56) References Cited

U.S. PATENT DOCUMENTS

2007/0183216 A1 * 8/2007 Chun et al. ............ 365/185.25
2008/0313357 A1 * 12/2008 Wang et al. .................. 710/14

* cited by examiner

*Primary Examiner*—Hetul Patel
(74) *Attorney, Agent, or Firm*—Blakely, Sokoloff, Taylor & Zafman LLP

(57) ABSTRACT

In some types of non-volatile memory devices, the same signal from a memory device may be used for two purposes: During a read operation, the signal may be used by a memory controller to latch the data that is being received from the memory device. During a block erase operation and/or a block write operation, the signal may be used to notify the memory controller that the operation has been completed by the memory device.

17 Claims, 5 Drawing Sheets

DUAL USE FOR DATA VALID SIGNAL IN NON-VOLATILE MEMORY

BACKGROUND

Flash memory devices perform block erase operations (i.e., erasing an entire block of memory locations at a time), which may take a relatively long time to accomplish. In NAND flash memory systems, block write operations may also take a relatively long time to accomplish. The memory controller, after triggering the flash memory device to perform the erase operation, may then perform operations with other memory devices while this erase or block write operation is being executed within the flash memory device. With current types of NAND flash memory interfaces, there is no efficient way for the memory controller to know when the erase operation is completed. Conventional solutions are to periodically poll the memory device (which is time consuming and inefficient), or to dedicate a separate signal line to each memory device to indicate completion (which adds to the pin count and takes up addition space). When high bandwidth and low pin-count are both important, neither of these alternatives is satisfactory.

BRIEF DESCRIPTION OF THE DRAWINGS

Some embodiments of the invention may be understood by referring to the following description and accompanying drawings that are used to illustrate embodiments of the invention. In the drawings.

DETAILED DESCRIPTION

Figure 1:
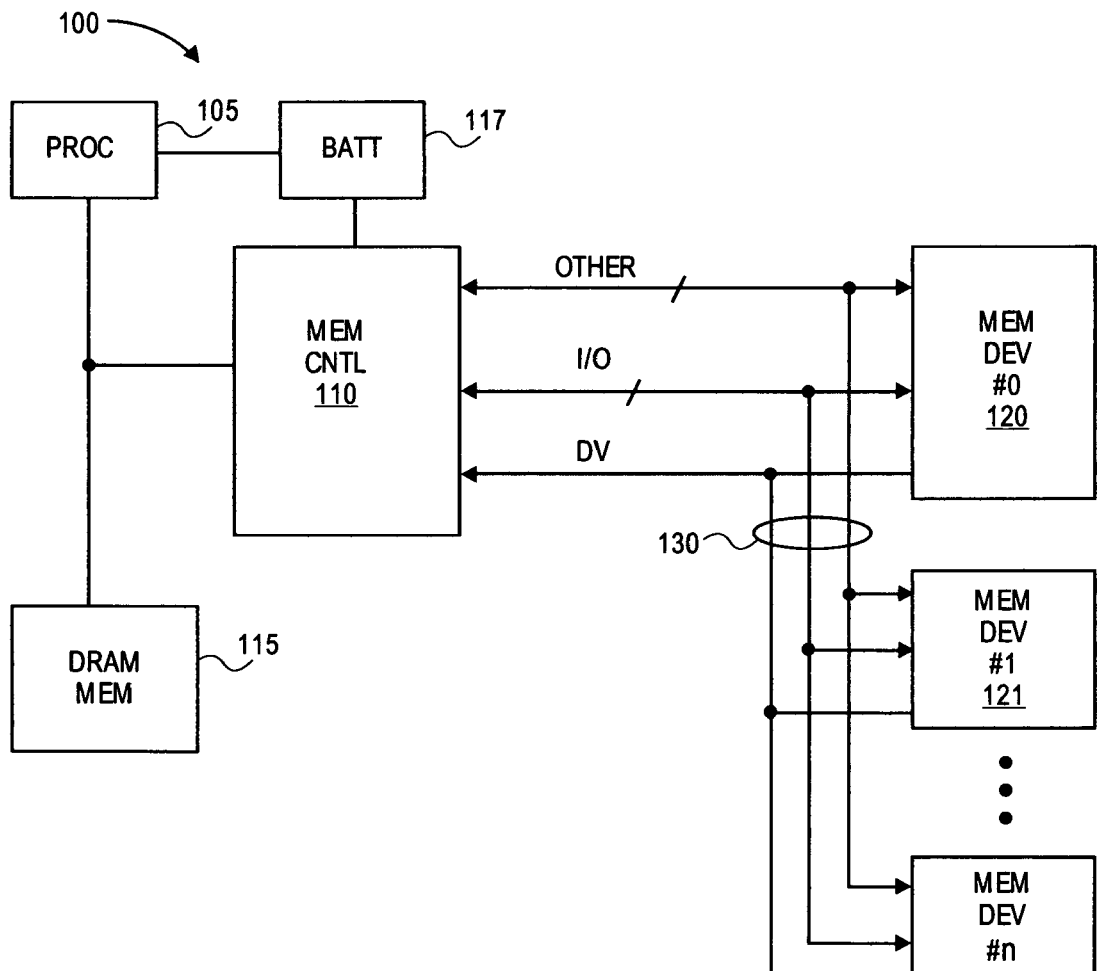
FIG. 1 shows a non-volatile memory system, according to an embodiment of the invention.

In the following description, numerous specific details are set forth. However, it is understood that embodiments of the invention may be practiced without these specific details. In other instances, well-known circuits, structures and techniques have not been shown in detail in order not to obscure an understanding of this description.

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

As used in the claims, unless otherwise specified the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

Various embodiments of the invention may be implemented in one or any combination of hardware, firmware, and software. The invention may also be implemented as instructions contained in or on a machine-readable medium, which may be read and executed by one or more processors to enable performance of the operations described herein. A machine-readable medium may include any mechanism for storing, transmitting, and/or receiving information in a form readable by a machine (e.g., a computer). For example, a machine-readable medium may include a storage medium, such as but not limited to read only memory (ROM); random access memory (RAM); magnetic disk storage media; optical storage media; a flash memory device, etc. A machine-readable medium may also include a propagated signal which has been modulated to encode the instructions, such as but not limited to electromagnetic, optical, or acoustical carrier wave signals.

In some embodiments of a non-volatile memory system, a particular signal from a memory device to a memory controller may serve dual purposes. When performing a Read operation, the signal may be used as a data latch, to permit the memory controller to latch the data from the memory device. When performing an Erase operation (and/or a block Write operation), the same signal may be used to indicate to the memory controller that the operation has been completed. If multiple devices share the same line for that signal, when the memory controller receives such a signal it may poll the memory devices to learn which one asserted the signal. Note, term 'block' when used to described either a write operation or a read operation, implies that the data transfer involves a block of data rather than the data at a single address in the memory device's internal array. In some embodiments, only the first address in the block is specified, and the remaining data comes from, or goes to, the succeeding addresses in the block without having to specify those individual addresses.

FIG. 1 shows a non-volatile memory system, according to an embodiment of the invention. In some embodiments, this may be a flash memory system. In some particular embodiments, this may be a NAND flash memory system or other system that transfers data in blocks rather than transferring the data from only one address in a read or write operation. In system 100, a processor 105 may control various types of memory, such as a dynamic random access memory (DRAM) 115, and a non-volatile memory system. In some embodiments a battery 117 may be used to provide operational power for the non-volatile memory system and/or other attached components. The non-volatile memory system may comprise a memory controller 110 to control operations with multiple non-volatile memory devices 120 through 12n (labeled as memory devices #0 through #n) that share some or all of the lines of a memory bus 130. In the illustrated embodiment the input/output (I/O) lines may be used to transfer data between the memory controller and the memory devices. Different embodiments may include different quantities of I/O lines (e.g., 4, 8, 16, 32, etc.) for parallel transfer of multiple bits of information. Depending on the configuration of the particular memory bus, multiple lines labeled 'OTHER' in the drawings may be used for various purposes. For example, in some embodiments OTHER may include selection lines to indicate which memory device is being selected for the ensuing operation. OTHER may include address lines to indicate a starting address within the memory array of the selected memory device. In some embodiments this selection and/or address information may be conveyed over the I/O lines, while OTHER includes signal lines to indicate which of those is currently being conveyed.

The data valid (DV) line may be shared by the memory devices and may be used for two purposes. During a read operation, the selected memory device may assert the DV signal as a timing signal so that the memory controller can latch the data appearing on the I/O lines. During a block write and/or erase operation, the same DV signal may be asserted by the memory device to indicate that it has completed the block write or erase operation. In some types of non-volatile memories, the erase operations and the block write operations may take a relatively long and/or variable time to complete. Once the memory controller has triggered the erase or block write operation to start, the memory controller may be freed up to perform other operations with other memory devices while the block write and/or erase operation is being performed by the selected memory device. The selected memory device may then notify the memory controller when the operation is complete by asserting a signal on the DV line. The term DV (Data Valid) is used in this document purely as a convenient label, but the various embodiments of the invention are broad enough to include systems that include similar signals that perform the same functions but are identified with different labels.

Figure 2:
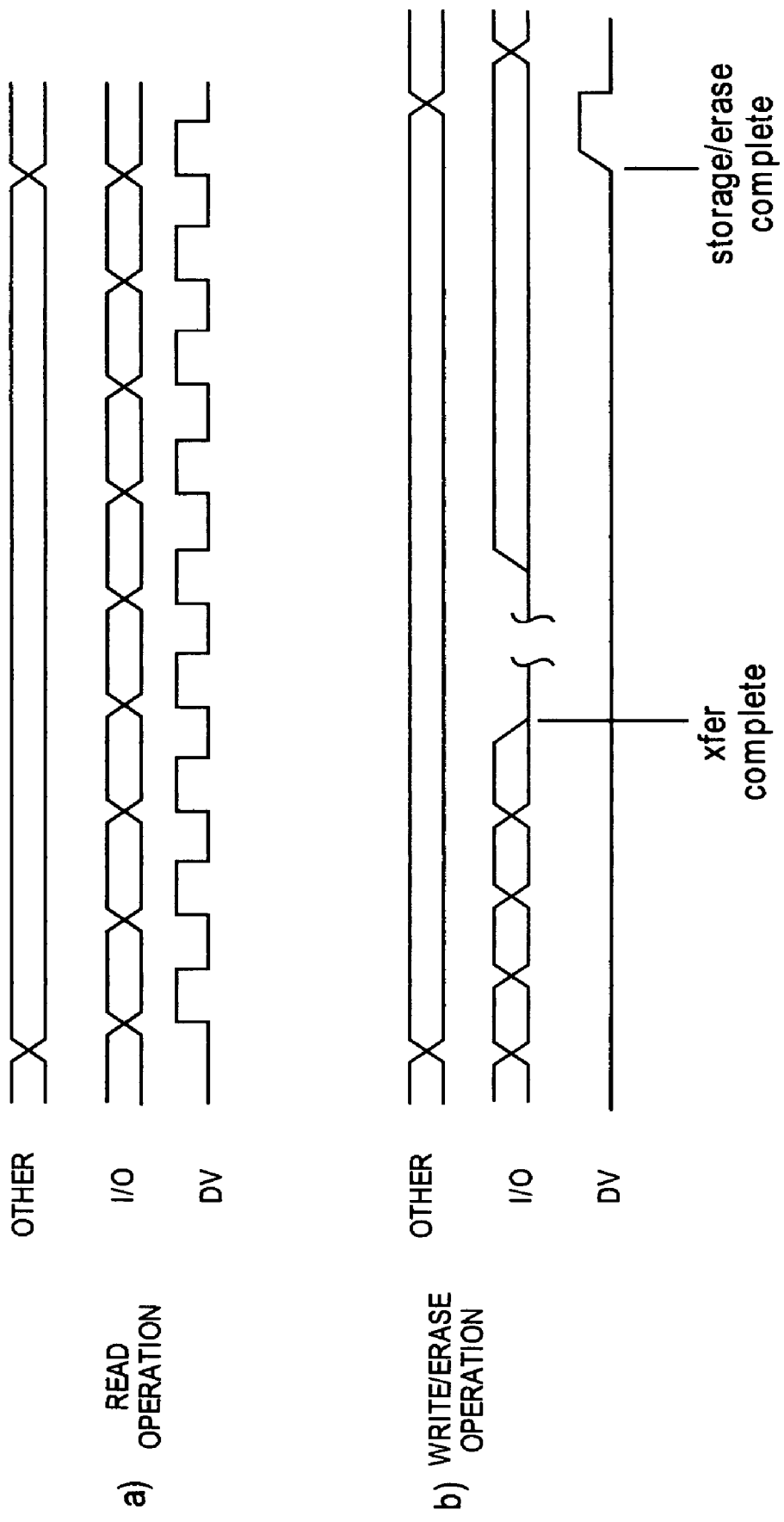
FIG. 2 shows timing diagrams for a read operation and a write operation, according to an embodiment of the invention.

FIG. 2 shows timing diagrams for memory bus signals during a read operation and a write operation, according to embodiments of the invention. During a read operation, in which a selected memory device provides data from its internal array to the memory controller, the selected memory device may place data on the I/O lines and assert the DV signal to provide the memory controller with a synchronizing signal to latch the data. The amount of data provided at one time may depend on the number of I/O lines being used. For example, a memory bus with eight I/O lines might provide eight bits of data for each DV assertion, and place another eight bits of data on the bus for the next DV assertion, etc. In the illustrated embodiment, the high-to-low transition of DV is used to latch the I/O signals, but other embodiments may use other techniques, such as using the low-to-high transition for latching. Note: only the actual transfer of data over the bus is shown here. The initial set-up of the read operation is not shown, and may use any feasible technique. In the illustrated embodiment, the OTHER signals may or may not be used during this time, and are therefore not shown in detail.

For a write operation, the DV signal may remain unasserted during the data transfer, which is shown by the I/O lines changing state under control of the memory controller. At the indicated point, the transfer of write data from the memory controller to the selected I/O device is complete. However, some types of non-volatile memory cannot store the data in their array as quickly as the data is provided over the I/O lines, and must buffer the transferred data in a cache or other temporary block storage. This frees up the memory controller to perform other tasks with other memory devices while this memory device is completing the task of storing the buffered data in its memory array. When the storage operation completes at the indicated point in the timing diagram, this memory device may assert the DV signal to alert the memory controller that the write operation has been completed. The signals on the I/O lines and the OTHER lines may assume any feasible state during the storage operation, as long as they do not interfere with the storage operation. In some embodiments, the I/O lines and OTHER lines may be used to communicate with other memory devices during the storage operation.

The timing for an erase operation may be similar to that for a write operation. Although a block of write data is not transferred over the I/O lines for an erase operation, information about which block(s) of the memory device are to be erased may be transferred over the I/O lines, until the 'xfer complete' point in the timing diagram. Then the memory device may begin the internal erase operation, and the memory controller may be free to perform other operations with other memory devices. When the erase operation is complete, the memory device may assert the DV line to indicate such completion to the memory controller.

Because the DV line is being used in different ways for read operations than for write operations, it may be important that no erase or write operation with one memory device is allowed to complete while a read operation with another memory device is in progress. If that were allowed, confusion over the meaning of the DV signal might result. In some embodiments, multiple erase and/or block write operations with different memory devices on the same memory bus may be allowed to progress concurrently, but no read operations will be permitted on the bus during that time.

Since asserted DV signals may arrive at the memory controller at unpredictable times, some embodiments of memory controller may use interrupt-type circuitry to cause the memory controller to be able to respond immediately whenever an asserted DV signal is received and the memory controller is in a write and/or erase mode of control. Other embodiments of memory controller may simply examine the state of the DV line periodically. Various techniques may be used to process a received DV signal, such as but not limited to dedicated circuitry, a state machine, executable code, etc., or any combination of these or other techniques.

Figure 3:
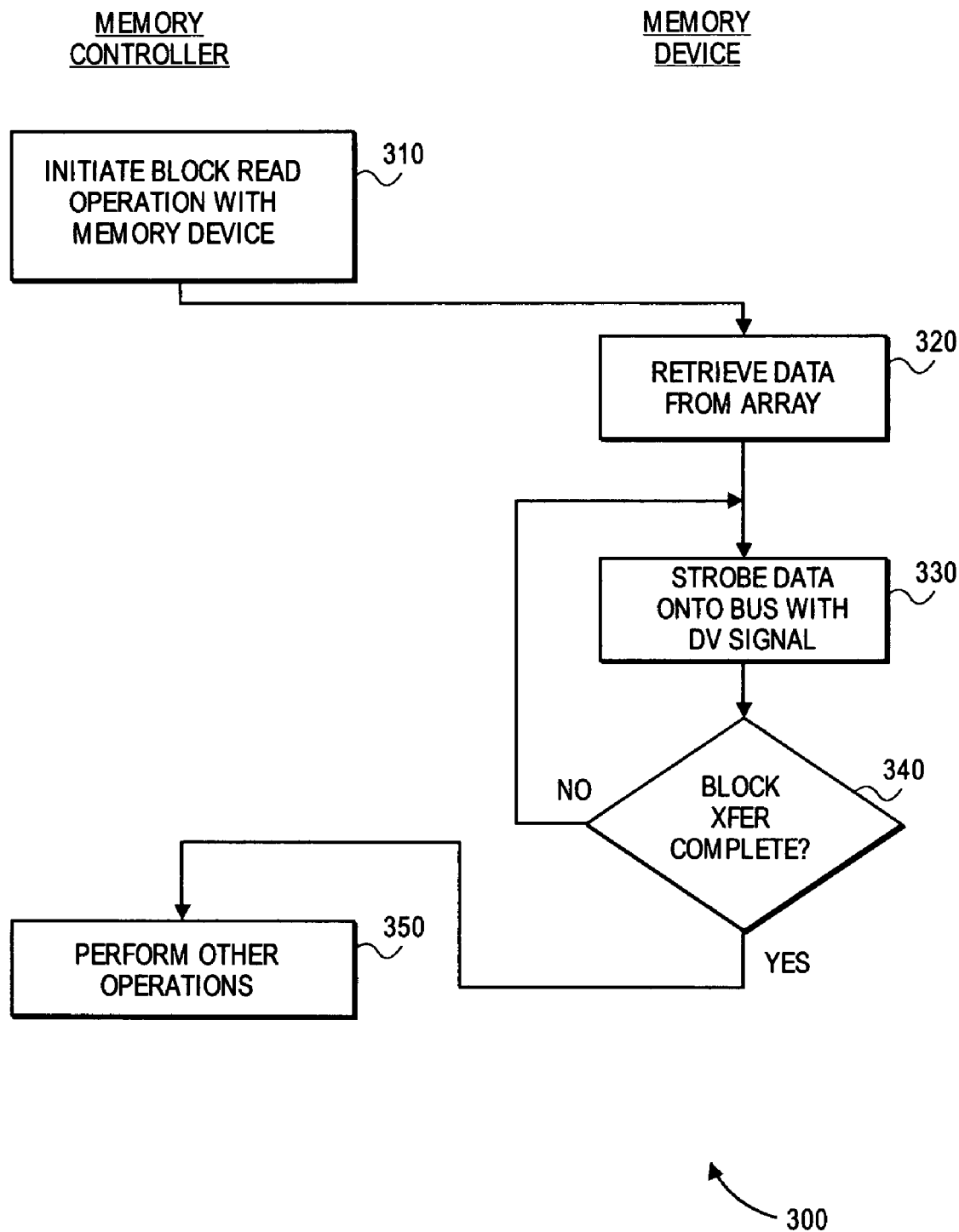
FIG. 3 shows a flow diagram of a method of performing a block read operation, according to an embodiment of the invention.

FIG. 3 shows a flow diagram of a method of performing a block read operation, according to an embodiment of the invention. In flow diagram 300, at 310 a memory controller can initiate a block read operation with a selected memory device, during which the selected memory device may transfer data from the memory device's internal array to the memory controller. The read operation may be initiated in various ways, such as but not limited to issuing a read command on the memory bus. The specifics of how the read operation is initiated are not further described here because they are not considered necessary to an understanding of the various embodiments of the invention. After being instructed to begin the block read operation, the selected memory device may retrieve data from the selected area of its array at 320, and at 330 assert the DV signal on the memory bus as a strobe to provide timing information for latching the data that is on the I/O lines. The DV signal may be asserted again and again as each new set of data appears on the I/O line. When the block transfer has been completed, as determined at 340, the memory controller may be free to perform other operations at 350, including operations with other memory devices.

Figure 4:
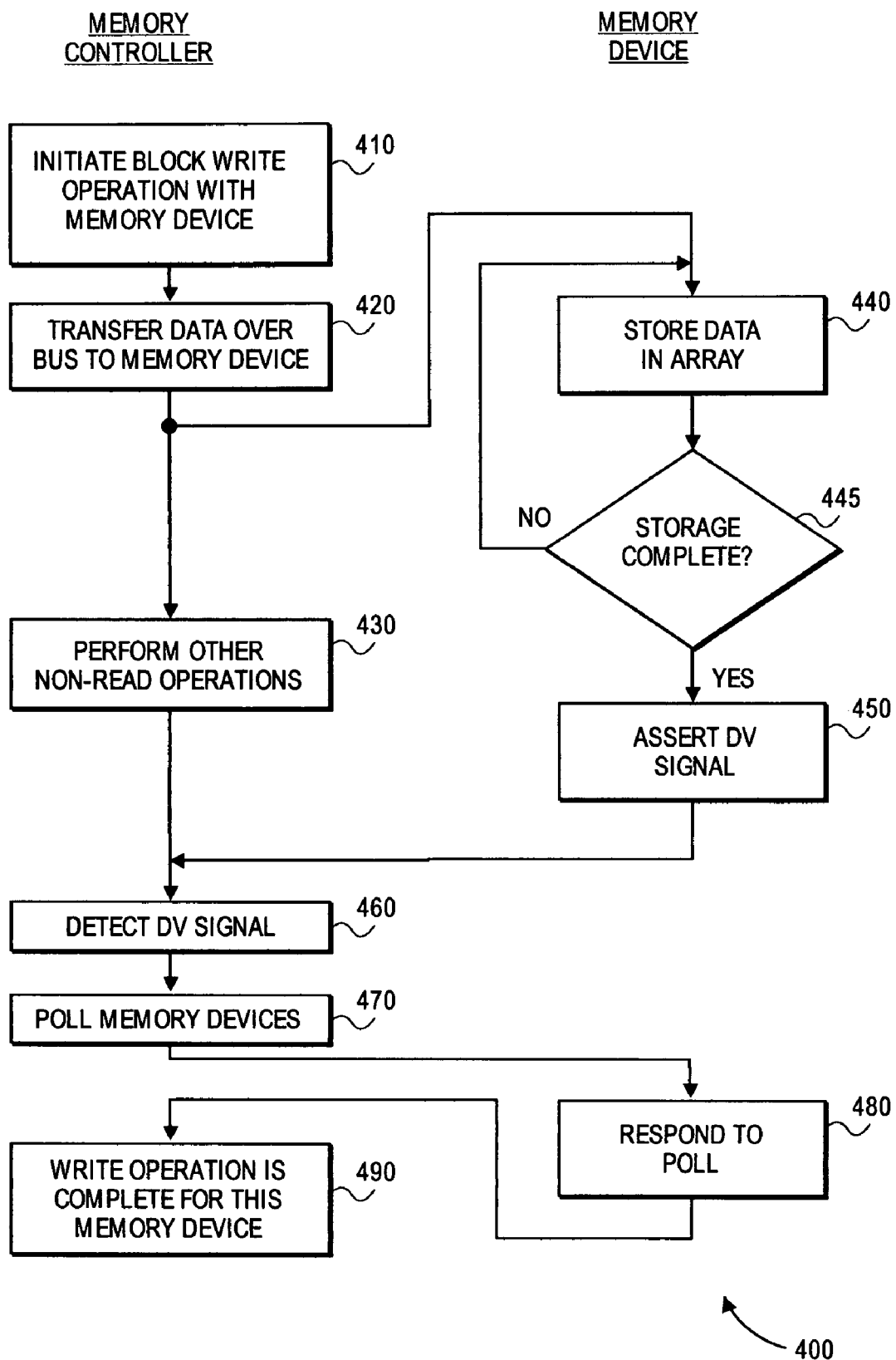
FIG. 4 shows a flow diagram of a method of performing a block write operation, according to an embodiment of the invention.

FIG. 4 shows a flow diagram of a method of performing a block write operation, according to an embodiment of the invention. In flow diagram 400, at 410 a memory controller may initiate a block write operation with a selected memory device. This transfer may be initiated in any feasible manner, such as but not limited to issuing a write command on the memory bus. The specifics of how the write operation is initiated are not further described here because they are not considered necessary for an understanding of the various embodiments of the invention. At 420 the data may be transferred over the memory bus from the memory controller to the selected memory device. As the selected memory device begins receiving the data, it may begin storing that data in its internal array at 440.

However, if the data transfer over the memory bus occurs at a faster rate than the storage operation, when the transfer operation is complete much of the data may still be in a buffer in the memory device, waiting to be stored in the array. The memory controller may then begin performing other operations at 430, possibly with other memory devices, while this selected memory device is still storing the received data in its internal array at 440. When the data has all been stored, as determined at 445, the memory device may assert the DV signal at 450 to notify the memory controller that the block write operation is complete.

If multiple memory devices are concurrently performing block write storage operations (and/or block erase operations, to be described later) and they are sharing the same DV line, then when the memory controller receives the DV signal at 460 it may not be apparent which memory device asserted that DV signal. The memory controller may then initiate an inquiry of some sort, such as by polling the memory devices at 470. The memory device that asserted the DV signal may then respond to the poll at 480 by identifying itself. At 490 the memory controller may then indicate within its internal circuitry, and/or may notify an external device, that the block write operation has been completed.

Because of the unscheduled nature of the DV signals from the various memory devices, it is possible that occasionally two or more memory devices may assert the DV signal at the same time, or at least close enough together that the memory controller cannot be certain that only one memory device has asserted the DV signal. The manner of polling the various memory devices at 470 may be designed to handle this situation, such as by polling every memory device even if one device has already identified itself.

Figure 5:
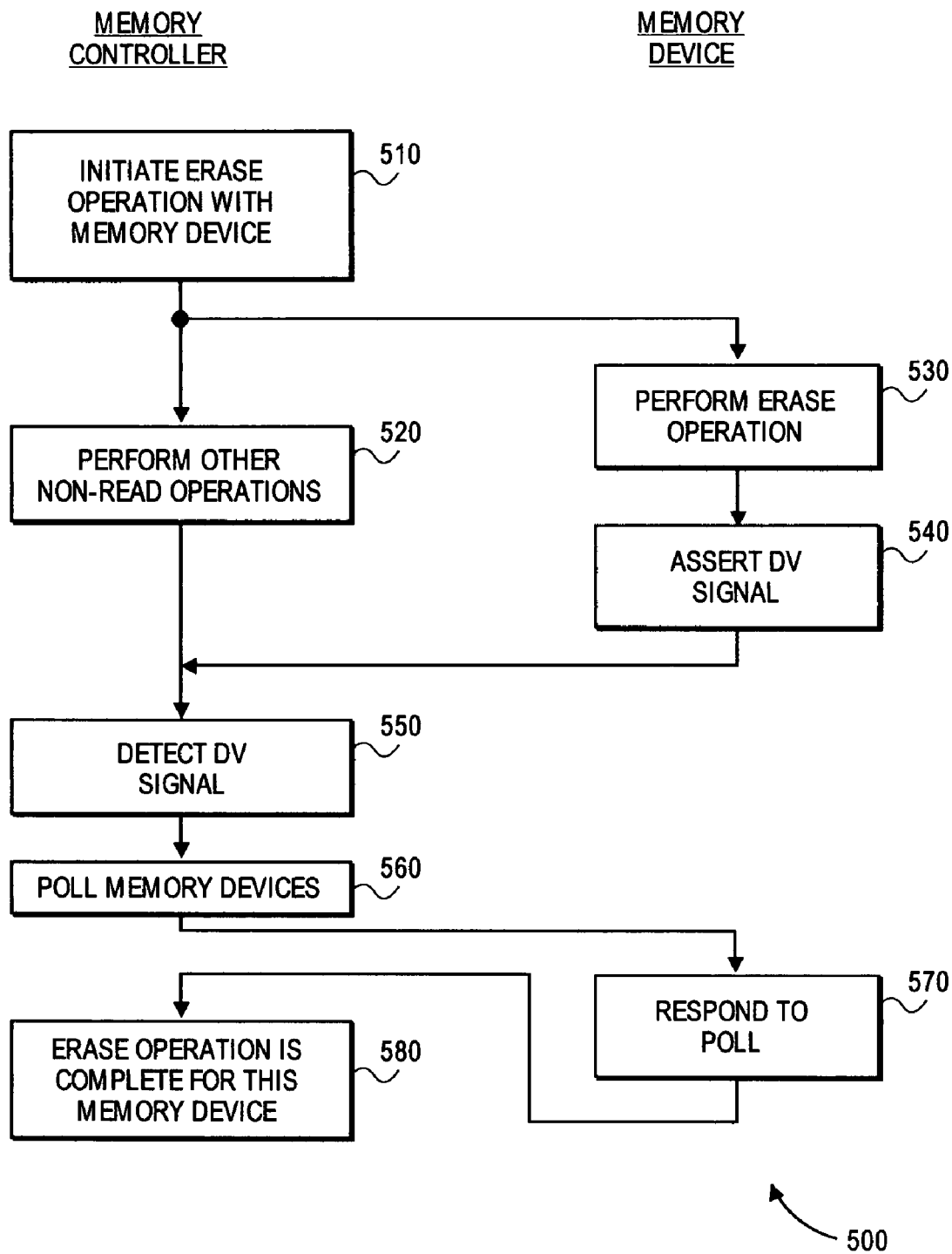
FIG. 5 shows a flow diagram of a method of performing a block erase operation, according to an embodiment of the invention.

FIG. 5 shows a flow diagram of a method of performing a block erase operation, according to an embodiment of the invention. In flow diagram 500, at 510 a memory controller may initiate a block erase operation with a selected memory device. This block erase may be initiated in any feasible manner, such as but not limited to issuing an erase command on the memory bus. The specifics of how the erase operation is initiated are not further described here because they are not considered necessary to an understanding of various embodiments of the invention. Once the block erase is initiated, the memory controller may begin performing other operations, possibly with other memory devices, at 520. At 530 the memory device may begin performing the erase operation on the selected block(s) with its internal circuitry. When the erase operation is complete, this memory device may notify the memory controller of that fact by asserting the DV signal at 540.

As described previously for FIG. 4, when the memory controller detects the DV line has been asserted, it may not know which of several memory devices asserted the signal. It can determine this by initiating an inquiry, such as by polling the eligible memory devices at 560. The device that asserted the DV line may then identify itself by responding appropriately to the poll at 570. After receiving that identification, at 580 the memory controller may take note of the fact that this particular memory device has completed its erase operation. As before, the polling and response technique may be such that assertions by multiple memory devices can be identified.

Although block erase and block write operations have been described separately, the memory controller may cause at least one block erase and at least one block write operation to occur concurrently in different memory devices. In such cases, the memory controller may keep track of which memory device is performing which operation, so that the memory controller will know which operation has been completed simply by identifying the particular memory device that completed its operation. In other embodiments, each memory device may indicate which operation it completed through the nature of its response to the poll.

The foregoing description is intended to be illustrative and not limiting. Variations will occur to those of skill in the art. Those variations are intended to be included in the various embodiments of the invention, which are limited only by the spirit and scope of the following claims.

What is claimed is:

1. An apparatus, comprising:
a first memory device containing a non-volatile memory array;
a memory controller to control operations with the memory array; and
a memory bus coupled between the first memory device and the memory controller, the memory bus including a signal line;
wherein the first memory device to perform a first set of multiple transmissions of a signal to the memory controller via the signal line, wherein for each of the multiple transmissions of the signal to the memory controller, the memory controller to perform a different respective latching of data on the memory bus during a read operation with the first memory device, and
wherein the first memory device further to perform a second sending of the signal to the memory controller via the signal line, the second sending of the signal to indicate to the memory controller an end of at least one of a block write operation and an erase operation with the first memory device.

2. The apparatus of claim 1, wherein the non-volatile memory array comprises a flash memory array.

3. The apparatus of claim 2, wherein the flash memory array comprises a NAND flash memory array.

4. The apparatus of claim 1, further comprising a second non-volatile memory device coupled to the signal line, wherein the second device is to use the signal line in a same manner as the first non-volatile memory device.

5. The apparatus of claim 1, wherein said end of the block write operation comprises completion of storing received data in the array.

6. The apparatus of claim 1, wherein said end of the erase operation comprises completion of a block erase operation in the array.

7. The apparatus of claim 1, further comprising a dynamic random access memory coupled to the memory controller.

8. The apparatus of claim 1, further comprising a battery coupled to the memory controller.

9. A method at a memory controller, the method comprising:
initiating a read operation with a first non-volatile (NV) memory device having a NV memory array;
receiving at the memory controller a first set of multiple instances of a signal sent from the first NV memory device on a particular signal line coupled between the first NV memory device and the memory controller;
for each of the multiple instances of the signal sent from the first NV memory device, the memory controller performing a different respective latching of data during the read operation;
initiating at least one of a block write operation and an erase operation with the first NV memory device, subsequent to completion of the read operation; and receiving at the memory controller a second signal sent from the first NV memory device on the particular signal line, the second signal indicating completion of the at least one of the block write operation and the erase operation with the first NV memory device.

10. The method of claim 9, further comprising initiating at least one of a block write operation and an erase operation with a second NV memory device, subsequent to said initiating the at least one of the block write operation and the erase operation with the first NV memory device, and prior to said receiving a second signal.

11. The method of claim 9, further comprising determining which of multiple non-volatile memory devices asserted the second signal.

12. A method at a first memory device having a non-volatile memory array, the method comprising:
   receiving at the first memory device a first command from a memory controller to perform a read operation;
   subsequent to said receiving the command to perform the read operation, the first memory device placing on a memory bus data read from the non-volatile memory array;
   the first memory device asserting a particular signal on the memory bus multiple times, wherein the multiple asserting of the particular signal is detected at the memory controller as a timing signal for successive latching by the memory controller of data placed on the memory bus;
   subsequent to said asserting the particular signal multiple times, receiving at the first memory device a second command from the memory controller to perform a write operation;
   receiving data from the memory controller subsequent to receiving the second command;
   storing the data from the memory controller in a buffer;
   writing the data from the buffer into the memory array; and
   asserting the particular signal on the memory bus to indicate to the memory controller completion of said writing the data into the memory array.

13. The method of claim 12, further comprising:
   receiving a poll from the memory controller, subsequent to said asserting the particular signal indicating completion of said writing; and
   responding to the poll.

14. An article comprising a machine-readable storage medium that contains instructions, which when executed by one or more processors result in performing computer operations comprising:
   initiating a read operation with a first non-volatile (NV) memory device having a NV memory array;
   receiving at a memory controller a first set of multiple instances of a signal sent from the first NV memory device on a particular signal line coupled between the first NV memory device and the memory controller;
   for each of the multiple instances of the signal from the first NV memory device, the memory controller performing a different respective latching of data during the read operation;
   initiating at least one of a block write operation and an erase operation with the first NV memory device, subsequent to completion of the read operation; and
   receiving at the memory controller a second signal sent from the first NV memory device on the particular signal line, the second signal indicating completion of the at least one of the block write operation and the erase operation with the first NV memory device.

15. The article of claim 14, wherein said computer operations further comprise initiating at least one of a block write operation and an erase operation with a second NV memory device, subsequent to said initiating the at least one of the block write operation and the erase operation with the first NV memory device, and prior to said receiving a second signal.

16. The article of claim 14, wherein said computer operations further comprise determining which of multiple non-volatile memory devices asserted the second signal.

17. The article of claim 14, wherein the operation of determining comprises polling multiple NAND memory devices.

* * * * *